US007616720B2

(12) United States Patent
Al-Adnani

(10) Patent No.: US 7,616,720 B2
(45) Date of Patent: Nov. 10, 2009

(54) MULTIRATE DIGITAL TRANSCEIVER

(75) Inventor: Adnan Al-Adnani, London (GB)

(73) Assignee: Panasonic Corporation, Osaka (JP)

( * ) Notice: Subject to any disclaimer, the term of this patent is extended or adjusted under 35 U.S.C. 154(b) by 873 days.

(21) Appl. No.: 10/495,307

(22) PCT Filed: Nov. 29, 2002

(86) PCT No.: PCT/GB02/05376

§ 371 (c)(1),
(2), (4) Date: May 12, 2004

(87) PCT Pub. No.: WO03/049395

PCT Pub. Date: Jun. 12, 2003

(65) Prior Publication Data

US 2005/0031046 A1 Feb. 10, 2005

(30) Foreign Application Priority Data

Dec. 5, 2001 (GB) .................. 0129114.5

(51) Int. Cl.
*H04B 1/10* (2006.01)
(52) U.S. Cl. .................. 375/350; 375/340; 375/324; 375/316
(58) Field of Classification Search .................. 375/130, 375/350, 260, 298, 233, 261, 232, 229, 316, 375/150, 346, 144, 340, 324; 370/343, 464, 370/252; 455/562.1, 278.1; 330/149
See application file for complete search history.

(56) References Cited

U.S. PATENT DOCUMENTS

| 5,177,700 A | 1/1993 | Gockler |
| 5,299,192 A | 3/1994 | Guo |
| 5,396,489 A | 3/1995 | Harrison |
| 5,454,007 A | 9/1995 | Dutta |
| 5,587,939 A | 12/1996 | Soleymani et al. |
| 5,590,156 A | 12/1996 | Carney |
| 5,602,847 A | 2/1997 | Pagano et al. |
| 5,631,610 A * | 5/1997 | Sandberg et al. ............ 375/270 |
| 5,867,479 A | 2/1999 | Butash |
| 5,933,467 A | 8/1999 | Sehier et al. |
| 5,995,539 A | 11/1999 | Miller |
| 5,999,573 A | 12/1999 | Zangi |

(Continued)

FOREIGN PATENT DOCUMENTS

EP 0945990 9/1999

(Continued)

OTHER PUBLICATIONS

Jose' Franca, Antonio Petraglia, and Sanjit K Mitra, Multirate Analog-Digtial Systems for Signal Processing and Conversion Feb. 1997, Proceeding of the IEEE, vol. 85. No. 2 pp. 242-260.*

(Continued)

*Primary Examiner*—Ted M Wang
(74) *Attorney, Agent, or Firm*—RatnerPrestia

(57) ABSTRACT

A multirate digital transceiver in which, on reception, signals are simultaneously decimated and coarsely down converted in an iterative process to narrow down a received wideband to a desired channel and, on transmission, signals are interpolated iteratively to achieve a desired sample rate/band width.

24 Claims, 9 Drawing Sheets

U.S. PATENT DOCUMENTS

| | | | |
|---|---|---|---|
| 6,023,717 | A | 2/2000 | Argyroudis |
| 6,049,573 | A | 4/2000 | Song |
| 6,134,268 | A * | 10/2000 | McCoy ................... 375/229 |
| 6,714,529 | B1 * | 3/2004 | Tanabe et al. ............ 370/343 |
| 7,158,591 | B2 * | 1/2007 | Harris ..................... 375/350 |

FOREIGN PATENT DOCUMENTS

| | | |
|---|---|---|
| EP | 1030458 | 8/2000 |
| JP | 4 220570 A | 8/1992 |
| JP | 5 014937 U | 2/1993 |
| WO | WO 99/62215 | 12/1999 |
| WO | WO 00/08764 | 2/2000 |
| WO | WO 00/24122 | 4/2000 |

OTHER PUBLICATIONS

Jose Franca et al., Multirate Analog-Digital Systems for Signal Processing and Conversion, Proceedings of the IEEE, vol. 85, No. 2, Feb. 1997, pp. 242-262, USA.

Partial English Translation of Official Action dated Aug. 19, 2008.

Bellanger et al., Digital Filtering by Polyphase Network: Application to Sample-Rate Alteration and Filter Banks, IEEE Trans. On Acoustics., Speech and Signal Processing., vol. ASSP-24, No. 2 Apr. 1976 pp. 109-114.

P. P. Vaidyanathan, Multirate Digital Filters, Filter Banks, Polyphase Networks, and Applications: A Tutorial, Proc. of IEEE, vol. 78, No. 1, Jan. 1990, pp. 56-93.

R. Crochiere; L. Rabiner, Multirate Digital Signal Processing, Englewood Cliffs, NJ Prentice Hall, AT&T; 1983.

M. J. T. Smith, T. P. Barnwell, III, Exact Reconstruction Techniques for Tree-structured Subband Coders, IEEE Trans., On Acoustics, Speech and Signal Processing, vol. ASSP-34, No. 3, Jun. 1986, pp. 434-441.

K. Nayebi, T.P. Barbwell, III, Nonuniform Filter Banks: A Reconstruction And Design Theory, IEEE Trans. On Signal Proc., vol. 41, No. 3, Mar. 1993, pp. 1114-1127.

T.Q. Nguyen, P. P. Vaidyanathan, Two-Channel Perfect Reconstruction FIR QMF Structures Which Yield Linear-Phase Analysis And Synthesis Filters, IEEE Trans, on Acostics, Speech and Signal Proc., vol. 37, May 1989 pp. 676-690.

O. Rioul, M. Vetterli, Wavelets and Signal Processing, IEEE Signal Processing Magazine, pp. 14-38, Oct. 1991, pp. 14-38.

M. Vetterli, A Theory of Multirate Filter Banks, IEEE Trans. Acoustics, Speech and Signal Proc. vol. ASSP-35, No. 3, Mar. 1987, pp. 356-372.

* cited by examiner

MULTIRATE DIGITAL TRANSCEIVER

The present invention relates to signal processing methods in digital transceivers and to digital receivers or transmitters in which such methods are implemented.

PRIOR ART

FIG. 1 is a diagram of a generic digital transceiver where a radio frequency (RP) signal is radiated/intercepted by an antenna and subsequently filtered, amplified, and upconverted/downconverted to an intermediate frequency (IF). After reception/transmission at interface 10, the signal is converted to analogue/digital signals using the D/A and A/D blocks 11, 12. The digital front end block 13 performs Digital Up/Downconversion and sample rate conversion of the digital signals. The Baseband DSP block 14 performs all the data processing necessary to prepare the signal for transmission/reception.

In the remaining discussion we will concentrate on the receiver side without loss of generality.

FIG. 2 is a diagram of the RF/IF block. The RF signal is filtered by an RF filter 20 and amplified using a Low Noise Amplifier (LNA). The mixer 22 downconverts the RF signal to IF. The IF filter 23 removes all the undesired signals that are produced by the mixing process.

FIG. 3 is a diagram of a conventional digital front-end receiver that performs frequency Downconversion and sampling rate reduction. A radio frequency (RF) signal or an Intermediate Frequency (IF) signal is sampled by an analogue-to-digital (A/D) converter 12. The sampled signal is mixed down to baseband by digital mixers 30, 31 using the outputs of a Numerically Controlled Oscillator (NCO) 32 which generates sine and cosine signals that mix the sampled signals to In-phase (I) and Quadrature-phase (Q) baseband signals. The baseband I & Q signals are then filtered by low pass filters H(z) to attenuate the out of band signals. The filtered signal is then downsampled by a factor of M in decimators 33, 34 to reduce the sampling rate by retaining only one out of M samples.

The filtering and downsampling operations can be implemented using a computationally efficient polyphase structure as shown in FIG. 4.

The input signal is serial to parallel converted into M subsignals in converter 37, which immediately reduces the sampling rate to 1/M of the input sampling rate. The filter N tap filter H(z) is divided into N/M tap subfilters $H_0(z)$, $H_1(z)$, $H_2(z)$, $H_{M-1}(z)$ operating at 1/M the original sampling rate. The polyphase structure requires M times less numerical operations than the original structure. The outputs of the subfilters are recombined in adder 38.

FIG. 5 is a diagram of a polyphase filter where H(z) is an N tap FIR filter and M=2.

On the left we see a standard diagram for a FIR filter 40 followed by a decimator 41. The equivalent polyphase structure comprises serial to parallel converter 42 having two outputs for odd and even samples respectively. Even samples are processed by even filter elements $h_0$, $h_2$, $h_4$ etc. and odd samples are processed by odd elements $h_1$, $h_3$ etc. and the result is added in adder 43 to produce a signal having half the sample rate of this input signal.

SUMMARY OF INVENTION

The present invention addresses the computational complexity of the Digital front-end in FIG. 3, and proposes a computationally efficient architecture for multi carrier signals.

The problems addressed are:

The digital signal is converted to baseband using the NCO immediately after the A/D, which means operating at the A/D sampling rate.

The digital signal is converted to a complex signal (Real and Imaginary paths), thus the following operations are duplicated for both paths.

The NCO performs single carrier tuning only to baseband, thus the filter H(z), is a low pass filter that attenuates the other carriers, and the downsampler reduces the sampling rate as required.

To receive all the digitised carriers in a wideband signals, parallel sections of digital the digital front-end have to be implemented thus increasing the complexity considerably for multicarrier receivers.

The present invention provides a method of processing a digital signal obtained by sampling a wideband of carrier frequencies at a rate Fs, in order to obtain information from a desired channel of carrier frequencies within said wideband, said method comprising:

(a) coverting the sampled input signal into M subsignals, where M is an integer greater than 1, each subsignal having a sample rate equal to Fs/M;

(b) applying the subsignals to an M-channel bank of band pass filters each having a different pass band within said wideband;

(c) selecting the output from the one of said filters containing said channel of carrier frequencies; and (d) repeating steps a), b) and c) using as the input the output selected at step c) until the next repetition would exclude frequencies in said desired channel.

Thus, the invention provides a novel technique for the digital front end that reduces the computational complexity considerably by performing the multiband Decimation and Downconversion simultaneously using Multirate filter banks.

At each iteration of the steps (a), (b), and (c), the sample frequency and the bandwidth of the signals being processed are reduced by a factor of M and thus decimation and coarse downconversion are performed at the same time. The conversion of the signal to complex I and Q signals can be performed after the step (d), at which point the sampling rate has already been reduced.

In the preferred process according to the invention, the value of M is the same for each repetition of steps (a), (b) and (c), and preferably 2 whereby each of the two filters in the bank may pass half of the band of frequencies applied to the filter bank. The filters may be Quadrature mirror filters.

The invention also provides apparatus for processing digital signals including a digital signal processor for processing a digital signal obtained by sampling a wideband of carrier frequencies at a rate Fs, in order to obtain information from a desired channel of carrier frequencies within said wideband, said processor comprising: means for converting the sampled input signal into M subsignals, where M is an integer greater than I, each subsignal having a sample rate equal to Fs/M: an M-channel bank of filters each having a different passband within said wideband each for receiving a respective one of said subsignals: means for selecting the output from one of said filters containing said channel of carrier frequencie; and means for feeding back the selected signal to said converting means until the output from said selecting means would exclude frequencies in said desired channel, as well as a receiver incorporating this apparatus. Preferred features of this apparatus further include means for converting the output from said selecting means to complex signals. In these example embodiments, M may be equal to 2. In addition, each filter may pass half of the band of frequencies applied to the filter bank and the filters may be quatrature mirror filters.

The method described above can be applied to the processing of signals for transmission. Thus another aspect of the invention provides a method of processing a digital signal for transmission comprising the steps of:
(a) applying the signal to an M channel filter bank;
(b) parallel to serial converting the signals output from the M filters in the filter bank to produce an interpolated signal whose sample rate is M times the sample rate of the input signal and from which images produced by the interpolation process have been rejected; and
(c) repeating steps (a) and (b) until a desired sample rate and/or signal bandwidth is achieved.

The invention also provides apparatus for processing digital signals for transmission comprising: an M channel filter bank: parallel to serial converting means for converting parallel signals received from the filter bank into serial signals: the serial output being an interpolated signal whose sample rate is M times the sample rate of the input and from which images produced by the interpolation process have been rejected: and means feeding said serial output signal back to the M channel filter bank until a desired sample rate is achieved as well as a radio transmitter incorporating this apparatus. Preferred features of this apparatus further include means for converting complex signals to real signals, the output of said converting means being supplied to said filter bank. In these example embodiments, M may be equal to 2 and the filters may be quadrature mirror filters. In addition, the apparatus may comprise means for inverting signals before they are supplied to said filter bank. Furthermore, said inverting means may be incorporated in channel selection means and said channel selection means may determine whether or not to invert signals depending on the frequency band on which they are to be transmitted.

An embodiment of the invention will now be described by way of example only and with reference to the accompanying drawings in which.

Figure 6:
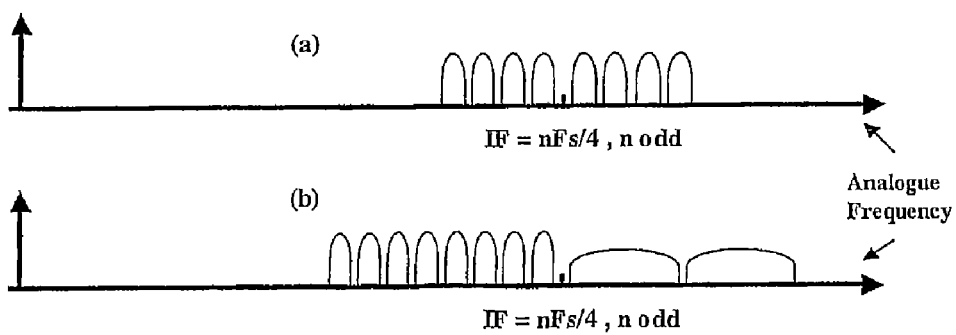
Figure 7:
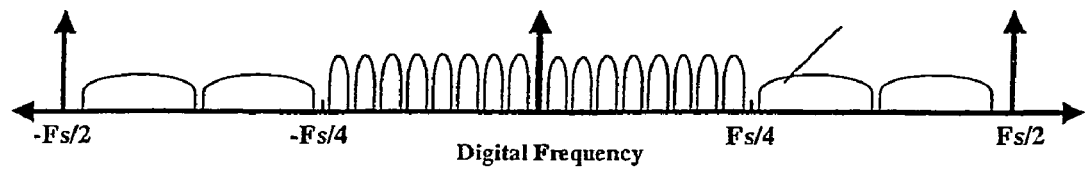
Figure 8:
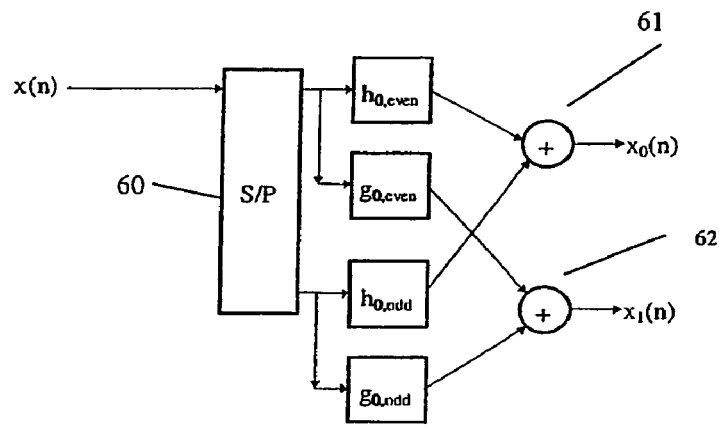
Figure 9:
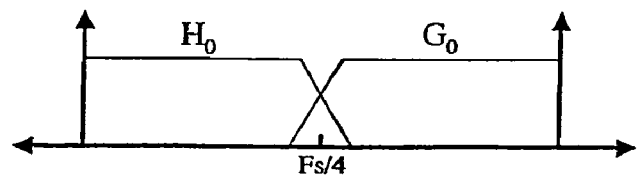
Figure 10:
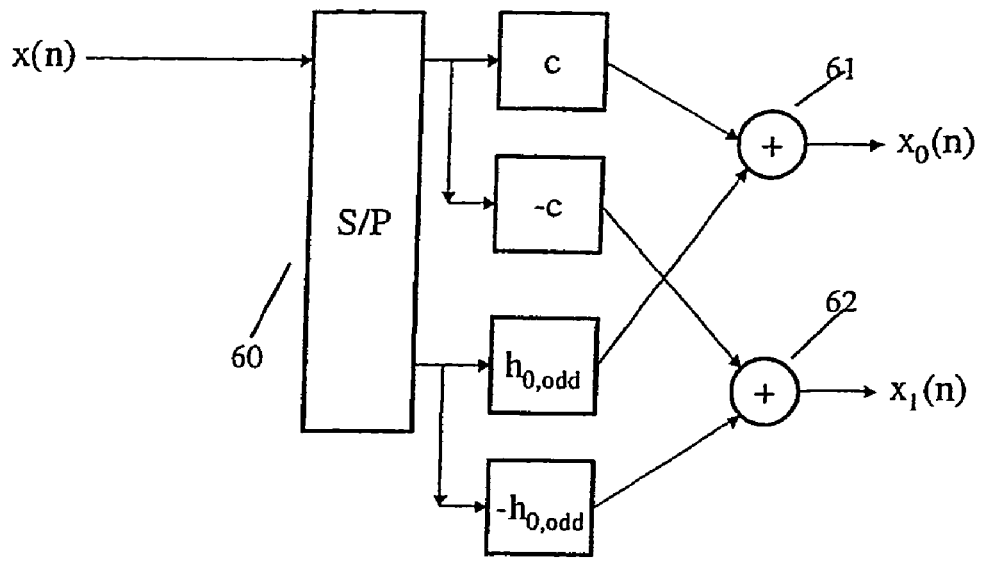
Figure 11:
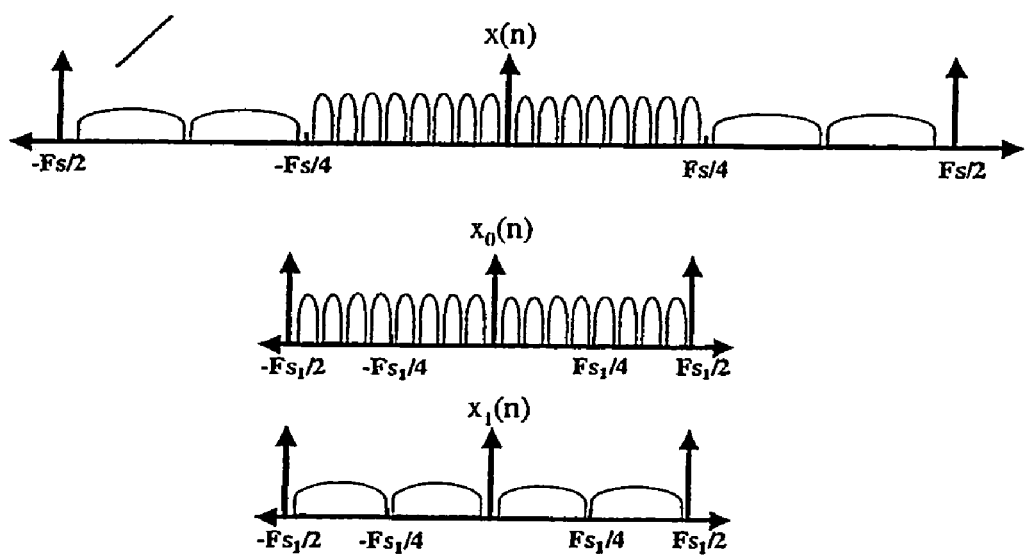
Figure 12:
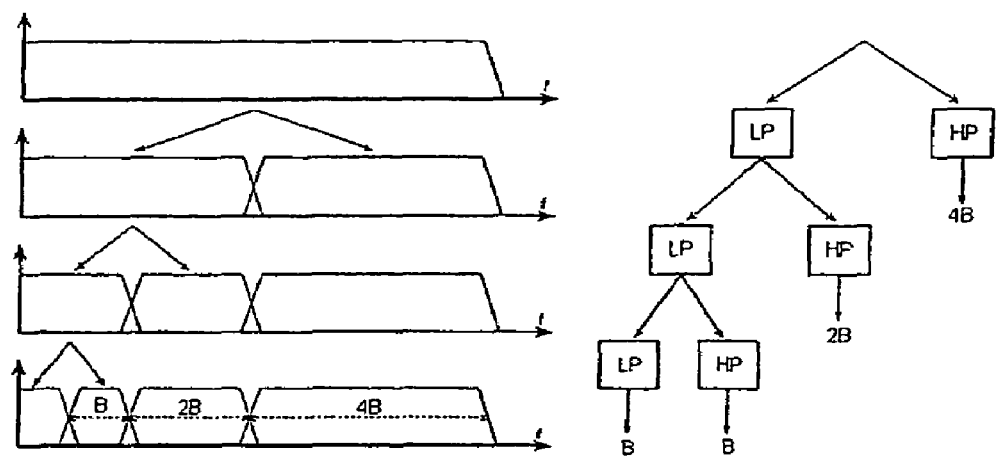
Figure 13:
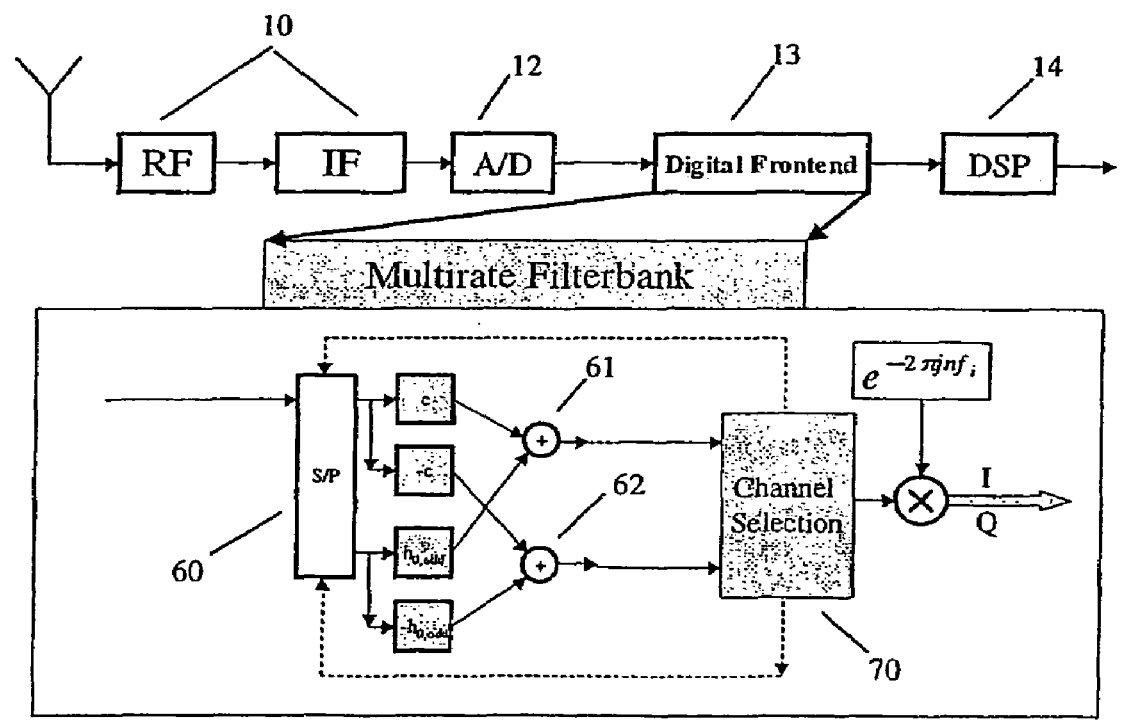

FIGS. 6 (*a*) and (*b*) show the analogue frequency spectra of uniform and multi standards wideband signals;

FIG. 7 shows the digital frequency spectrum of the signal shown in FIG. 6(*b*) after digitisation;

FIG. 8 is a block diagram of a polyphase structure for use in carrying out the method of the invention;

FIG. 9 illustrates the characteristics of quadrature mirror filters (QMF);

FIG. 10 illustrates a polyphase half band QMF filter bank;

FIG. 11 show a typical input spectrum and the output spectra of the respective filters;

FIG. 12 is a schematic diagram of an iterated two channel filter bank;

FIG. 13 is a block diagram of multirate receiver architecture; and

Figure 14:
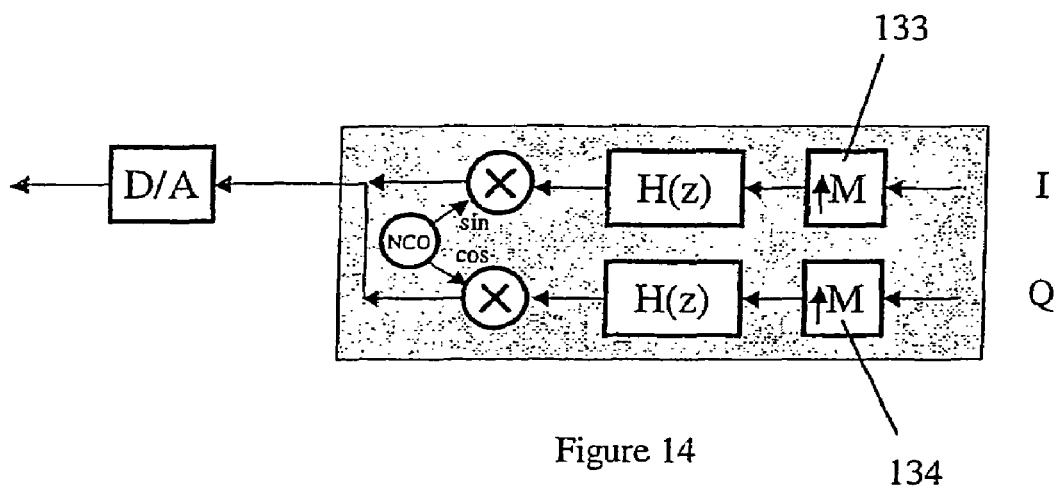
Figure 15:
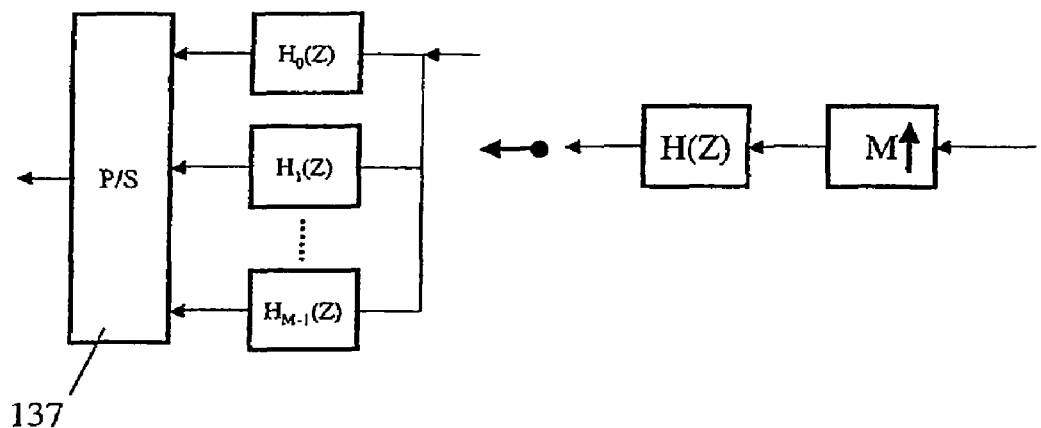
Figure 16:
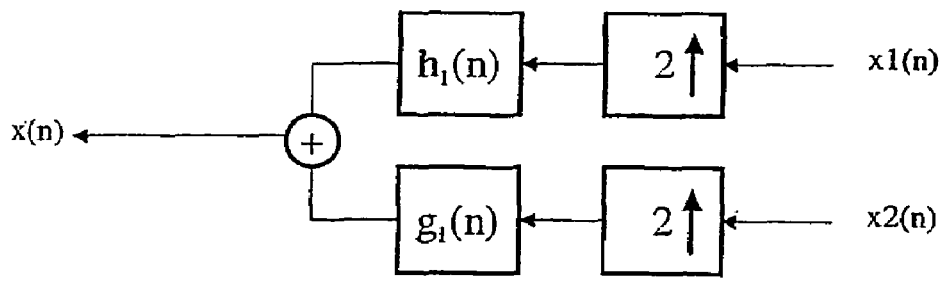
Figure 17:
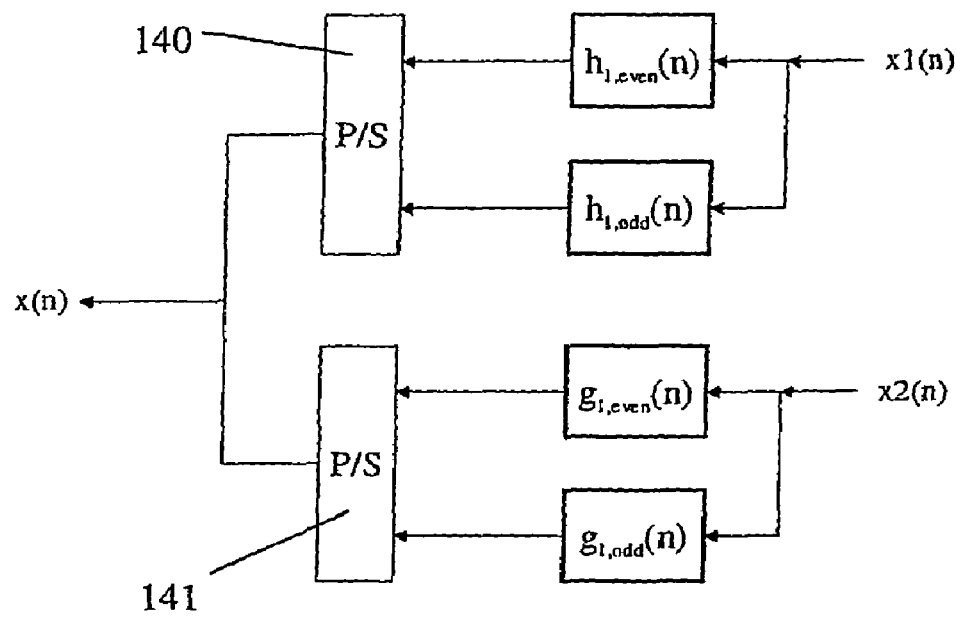
Figure 18:
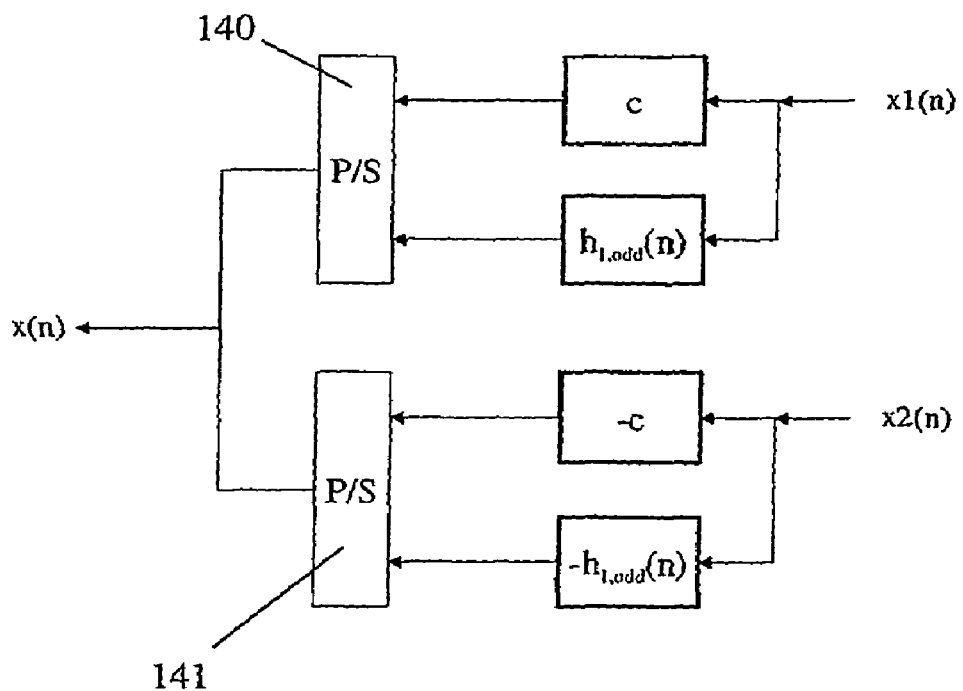
Figure 19:
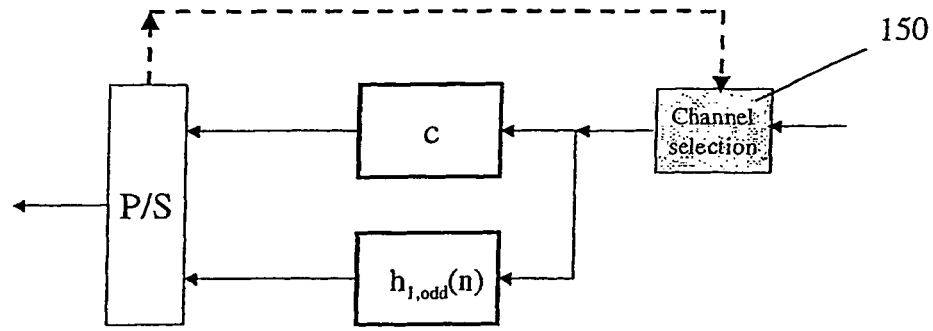
Figure 20:
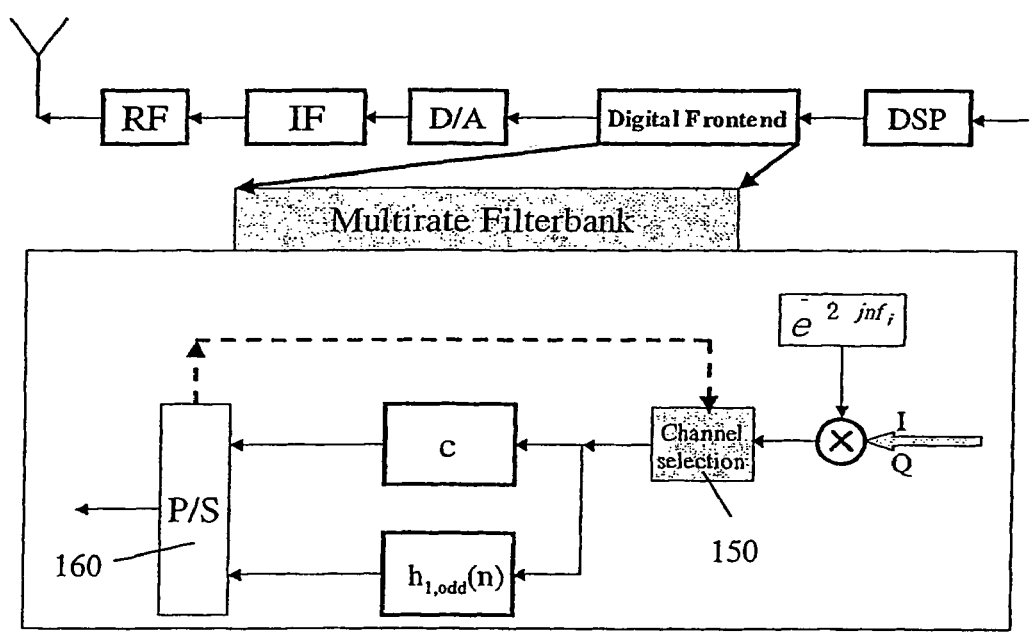
Figure 21:
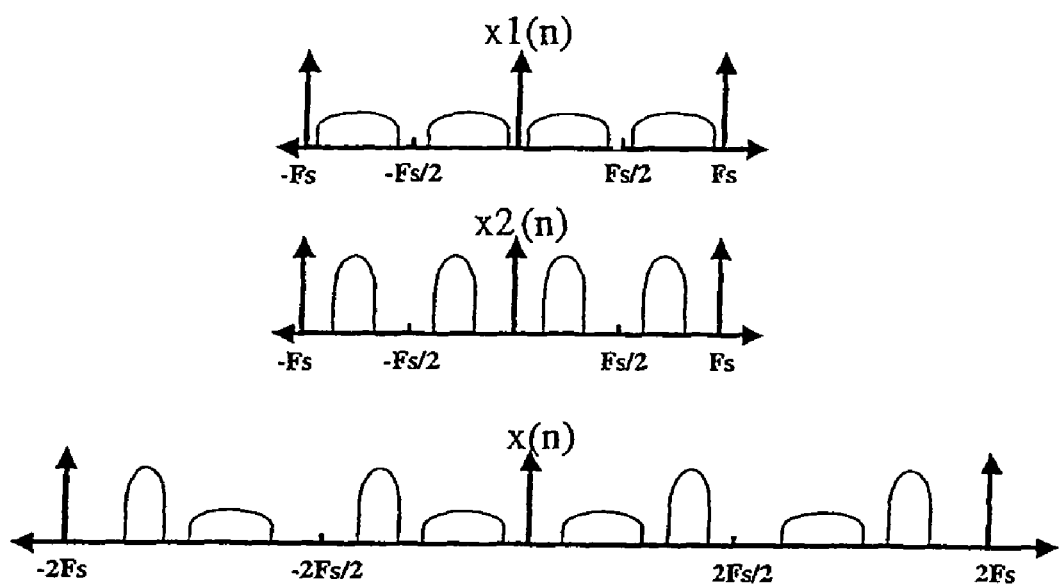

FIG. 14 is a diagram of a conventional digital front-end transmitter that performs upsampling and frequency upconversion;

FIG. 15 shows a polyphase implementation of interpolation;

FIG. 16 is a diagram of a two channel synthesis filter bank;

FIG. 17 shows a polyphase implementation of the circuit of FIG. 16;

FIG. 18 shows a polyphase filter bank as in FIG. 17 in which the filters are constrained to be half band filters;

FIG. 19 is a further simplification of FIG. 18;

FIG. 20 is a diagram of a complete transmitter section incorporating the filter bank of FIG. 20; and FIG. 21 shows graphs of signals input to and output from the circuit of FIG. 18.

Referring back to FIG. 3 the A/D 12 samples a multicarrier IF signal that may be comprised of a number of equal bandwidth signals uniformly spaced centred around the IF frequency, or a number of unequal bandwidth signals for a multi standard radio representing differing symbol rates as shown in FIG. 6.

Figure 2:
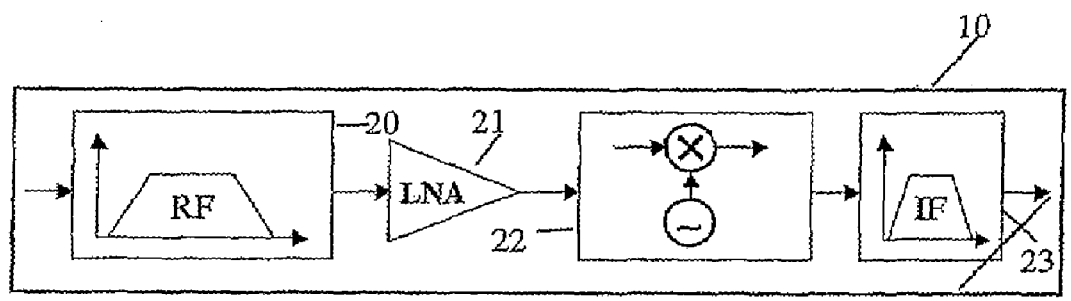
FIG. 2 is a block diagram showing the typical components of an r.f. block used in the transceiver of FIG. 1.
Figure 5:
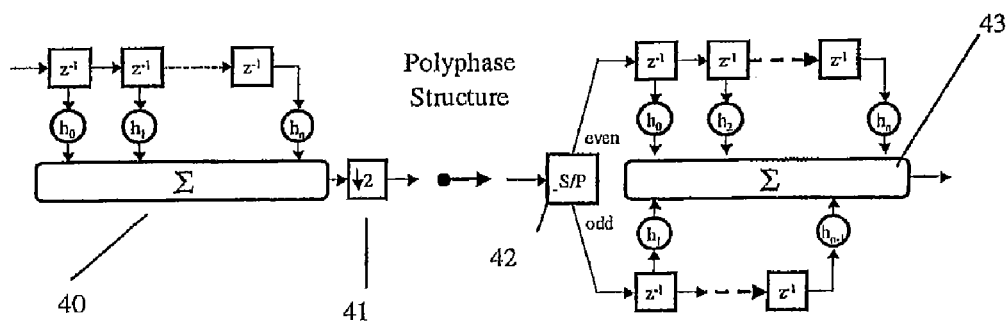
FIG. 5 illustrates a specific polyphase structure of the general type shown in FIG. 4 with a decimation factor of 2.

The signals in FIG. 5 are produced by a wideband RF section comprising one or more serial or parallel sections as in FIG. 2 that are capable of downconverting the required bands to the specified IF frequency To simplify the architecture we need to ensure that the digitised signals are centred around quarter of the sampling rate, a fixed IF frequency is imposed equal to odd multiples of quarter of the sampling frequency.

After digitisation the entire band is centred between 0 and Fs/2 and periodically repeated as in FIG. 7.

Figure 3:
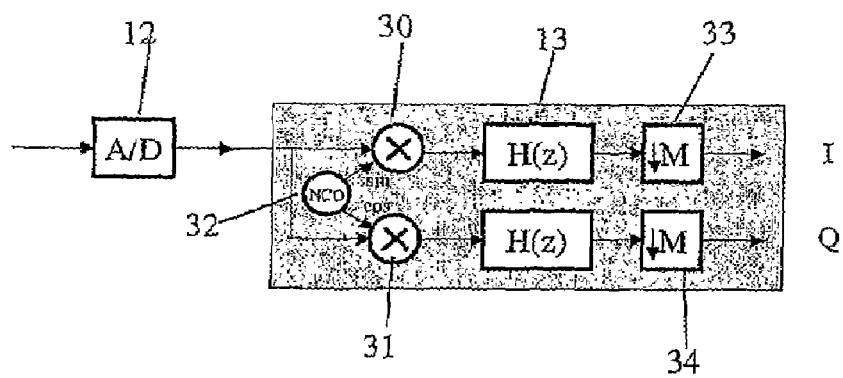
FIG. 3 illustrates a conventional digital front-end receiver.
Figure 4:
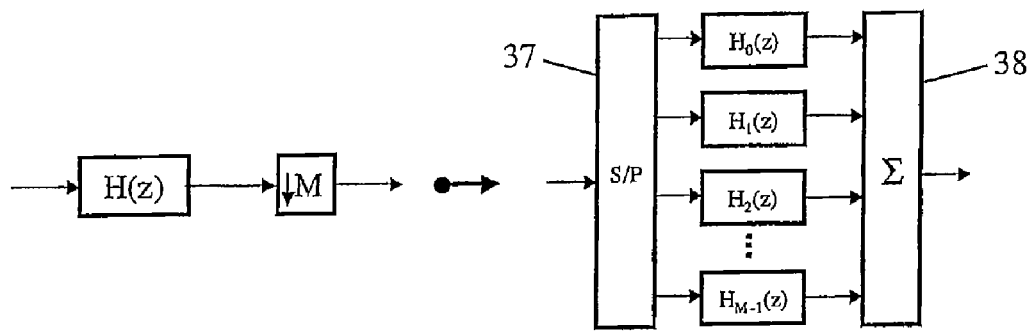
FIG. 4 illustrates an example of a polyphase structure for carrying out filtering and downsampling operations.

In the prior art the multicarrier signal is converted to a baseband complex signal operating at the same high sampling frequency as the A/D before decimation (FIG. 3).

In the new design to be described below, the signal passes through a real coefficient Multirate filter bank after digitisation to decimate the required bandpass signals simultaneously and also perform coarse Downconversion without going to DC thus remaining a real signal which reduces the complexity of having to filter the signal on the real and complex paths.

The filter bank is implemented using a polyphase structure. FIG. 8 shows a polyphase two channel filter bank structure that will be the building block of our design, where h0 and g0 are low pass and high pass filters respectively satisfying the Quadrature Mirror Filter (QMF) relationship:

$$g_0(n)=(-1)^n h_0(n)$$

$$G_0(\omega)=H_0(-\omega)$$

the filters form mirror symmetry around quarter of the sampling rate as shown in FIG. 9.

Input signals x(n) are applied to serial to parallel converter 60 to provide two signal paths bearing alternate samples. All samples are applied to both filters $h_0$ and $g_0$ and the filter out puts are added at adders 61, 62 to provide output signals $x_0(n)$ from filter $h_0$ and x(n) from filter $g_0$.

The filter bank is determined once the required prototype filter is designed. The structure in FIG. 8 can be further simplified by constraining the prototype filter h0 to be a half band filter.

A half band FIR low pass filter $$H(z) = \sum_{n=-N-1/2}^{N-1/2} h(n)z^{-n},$$

where N is odd has an impulse response that satisfies:

$$h(2n) = \begin{cases} c & n = 0 \\ 0 & \text{otherwise} \end{cases},$$

where c is a constant in polyphase form the filter becomes:

$$H(z) = c + z^{-1}H_{odd}(z^2)$$

following these principles FIG. 8 reduces to FIG. 10 which is completely determined by the prototype low pass filter h0. Like parts in FIGS. 8 and 10 have like reference numerals.

Filter response shape required to design the polyphase prototype filter is dictated by the guard frequency band (separating adjacent channels) to channel centre frequency spacing, filter passband gain uniformity, channel attenuation requirements, and the number of channels. The basic filter design can be stored in memory and simply re configured by changing the coefficients for a particular application.

The signal x(n) enters a parallel to serial converter that immediately reduces the sampling rate by a factor of two where its filtered to produce the decimated signals $x_0(n)$ and $x_1(n)$.

FIG. 11 shows an example multicarrier Multirate signal that has been processed by the structure of FIG. 10.

The signal is downsampled to a new sampling frequency $Fs_1$, at the same time the signals above Fs/4 are folded back (i.e. downconverted). Thus the two differing signals representing two data rates (standards) are now separated into parallel signals with lower overall sampling rates.

The structure of FIG. 11 can be iterated as shown in FIG. 12 to further separate the required channel(s) to be further processed.

After performing the required decimation using the filter bank, the real-to-complex conversion to produce baseband I & Q signals centred at DC can be carried out for the individual channels at the lowest possible sampling rate. Further fine tuning of the sample rates for the I&Q signals to match the symbol rates for the particular standard can be performed by the DSP.

Figure 1:
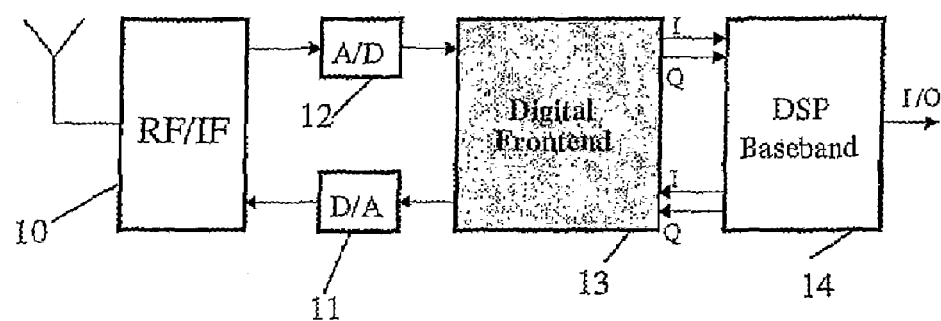
FIG. 1 is a block diagram of a generic digital transceiver of the type currently in use.

FIG. 13 shows the new Multirate architecture in receiver mode. Thus, the digital front end, already shown in FIG. 1, includes a multirate filter bank of the type shown in FIG. 10 whose outputs are supplied to channel selection means 70. Channel selection means 70 determines which channel or frequency band is to be selected and how many iterations of the filtering process are needed. The final output converted to complex signals I and Q for subsequent processing.

FIG. 14 is a diagram of a conventional digital front-end transmitter that performs upsampling and frequency upconversion. The baseband I & Q signals are first upsampled by a factor of M by upsamplers 133, 134 by inserting M-1 zeros between each sample. In the frequency domain this creates M-1 images of the baseband spectrum. The filter H(z) is an interpolation filter which is also called an image rejection filter. The NCO mixes up (upconverts) the interpolated signals to the Digital-to-Analogue (D/A) converter IF frequency.

As in the receiver section all the computationally intensive operations are carried out at the higher sampling rates on both the I & Q branch. The aim is to replace this by a computationally efficient Multirate filter bank to simultaneously perform the upsampling and frequency upconversion.

FIG. 15 shows the polyphase implementation of the interpolation operation. The filter H(z) is decomposed into M parallel filters, here the filtering is carried out at the lower sampling rate and then the parallel signals are combined using the parallel to serial converter 137 to form the upsampled signal. The output sampling rate is M times the input sampling rate.

For the remaining part we concentrate on the case where M=2, and the filters are FIR filters with N number of coefficients(taps).

FIG. 16 shows a 2 channel synthesis filter bank, where two different signals x1 and x2 are combined to form the signal x with twice the sampling rate. The filters $h_1$, and $g_1$ are low pass and high pass filters respectively related as in FIG. 9. They are equivalent to the filters $h_0$, and $g_0$.

The polyphase implementation of FIG. 16 is shown in FIG. 17.

The two signals x1(n) and x2(n) are two separate baseband signals to be transmitted in separate frequency bands so as not to interfere with each other, enabling them to be recovered by a receiver. Thus, the signals are applied to respective filters $h_n$, and $g_n$ whose outputs are applied to parallel to serial converters 140, 141 to produce a signal xn with a higher sampling rate.

By constraining the filters to be half band filters as in the receiver section, FIG. 17 reduces to FIG. 18

As we can see the lower branch filters are simply inverted versions of the upper branch filters. As shown in FIG. 18 each sample goes through filters c and h thus creating two samples from one to produce the upsampled signal FIG. 18 can be reduced to FIG. 19 as a recursive 2 channel filter bank, where the channel selection box 150 determines the number of iterations required to upconvert the selected input signal and the branch it is going to be placed by selecting the sign of the coefficients (i.e. inverted or not)

FIG. 20 shows the complete transmitter diagram with the digital IF section. This is similar to FIG. 13 with signals following reverse paths.

The baseband I & Q signals are complex to real upconverted to a near zero frequency $f_i$ and the channel selection box decides where to place the signal lower or upper frequency and the number of iterations required to upconvert the signal to IF before the D/A.

FIG. 21 shows a diagram of the signals x1(n), x2(n) and x(n) as applied to FIG. 18. The bandwidth is doubled and both the input signals are stacked together and simultaneously upsampled and upconverted. If only one channel is selected then only one of the signals is upsampled and upconverted.

Referring back to FIG. 20, if the signal output from parallel serial converter 160 fed back to channel selection block 150 has insufficient bandwidth/sampling rate, the signal is again applied to the filters h and c to be upsampled and upconverted.

The invention claimed is:

1. A method of processing a digital signal obtained by sampling a wideband of carrier frequencies at a rate Fs, in order to obtain information from a desired channel of carrier frequencies within said wideband, said method comprising:
   (a) converting the sampled input signal into M subsignals, where M is an integer greater than 1, each subsignal having a sample rate equal to Fs/M;
   (b) applying the subsignals to an M-channel bank of band pass filters each having a different pass band within said wideband;
   (c) selecting the output from the one of said filters containing said desired channel of carrier frequencies; and
   (d) repeating steps a), b) and c) using as the input the output selected at step c) until the next repetition would exclude carrier frequencies of said desired channel from said output.

2. A method as claimed in claim 1 in which following step (d), the output signal is converted to complex signals.

3. A method as claimed in claim 1 or 2 in which the value of M is the same for each repetition of steps a), b) and c).

4. A method as claimed in claim 1 in which M=2 for at least one execution of steps a), b) and c).

5. A method as claimed in claim 4 in which when M=2 each filter passes half of the band of frequencies applied to the filter bank.

6. A method as claimed in claim 4 in which the filters are quadrature mirror filters.

7. A digital signal processor for processing a digital signal obtained by sampling a wideband of carrier frequencies at a rate Fs, in order to obtain information from a desired channel of carrier frequencies within said wideband, said processor comprising:

means for converting the sampled input signal into M subsignals, where M is an integer greater than 1, each subsignal having a sample rate equal to Fs/M; an M-channel bank of filters each having a different passband within said wideband each for receiving a respective one of said subsignals;

means for selecting the output from one of said filters containing said desired channel of carrier frequencies; and means for iteratively feeding back the selected signal to said converting means until the output from said selecting means would exclude, at the next iteration, carrier frequencies in said desired channel.

8. A digital signal processor as claimed in claim 7 further comprising means for converting the output from said selecting means to complex signals.

9. A digital signal processor as claimed in claim 7 or 8 in which M=2.

10. A digital signal processor as claimed in claim 9 in which each filter passes half of the band frequencies applied to the filter bank.

11. A digital signal processor as claimed in claim 9 in which the filters are quadrature mirror filters.

12. A radio receiver incorporating a digital signal processor as claimed in claim 7.

13. A method of processing a digital signal for transmission comprising the steps of:

(a) applying the signal to an M channel filter bank where M is an integer greater than 1;

(b) parallel to serial converting the signals output from the M filters in the filter bank to produce an interpolated signal whose sample rate is M times the sample rate of the input signal and from which images produced by the interpolation process have been rejected; and (c) feeding, iteratively, the serial output signal back to the M channel filter bank;

(c)(d) repeating steps (a) and, (b) and (c) until a desired sample rate and/or signal bandwidth is achieved;

wherein the digital signal is in the form of a complex signal and is converted to a real signal prior to step (a).

14. A method as claimed in claim 13 in which M is the same for each repetition of steps (a) and (b).

15. A method as claimed in claim 13 in which M=2 for at least one repetition of steps (a) and (b).

16. A method as claimed in claim 15 in which when M=2 the filters are quadrature mirror filters.

17. A method as claimed in claim 16 in which, prior to at least one pass of step (a), the signal is inverted.

18. A method as claimed in claim 16 further comprising the step of determining whether or not to invert the signal according to the frequency band in which the signal is to be transmitted.

19. Apparatus for processing a digital signal for transmission comprising:

an M channel filter bank to which the digital signal is supplied, where M is an integer greater than 1;

parallel to serial converting means for converting parallel signals received from the filter bank into serial signals;

the serial output being an interpolated signal whose sample rate is M times the sample rate of the input and from which images produced by the interpolation process have been rejected;

means for iteratively feeding said serial output signal back to the M channel filter bank until a desired sample rate is achieved; and means for converting complex signals to real signals, the output of said converting means being supplied to said filter bank.

20. Apparatus as claimed in claim 19 in which M=2.

21. Apparatus as claimed in claim 20 in which the filters are quadrature mirror filters.

22. Apparatus as claimed in claim 21 further comprising means for inverting signals before they are supplied to said filter bank.

23. Apparatus as claimed in claim 22 in which said inverting means are incorporated in channel selection means and said channel selection means determines whether or not to invert signals depending on the frequency band on which they are to be transmitted.

24. A radio transmitter incorporating apparatus as claimed in claim 19.

* * * * *